United States Patent
Goh et al.

(10) Patent No.: US 12,341,041 B2
(45) Date of Patent: Jun. 24, 2025

(54) AUTOMATED OCAP INTERFACING SYSTEM AND METHOD

(71) Applicant: TEXAS INSTRUMENTS INCORPORATED, Dallas, TX (US)

(72) Inventors: Tian Oon Goh, Melaka (MY); Chui Yee Ou, Melaka (MY); Yew Ming Lim, Melaka (MY)

(73) Assignee: Texas Instruments Incorporated, Dallas, TX (US)

( * ) Notice: Subject to any disclaimer, the term of this patent is extended or adjusted under 35 U.S.C. 154(b) by 301 days.

(21) Appl. No.: 18/088,269

(22) Filed: Dec. 23, 2022

(65) Prior Publication Data

US 2024/0213063 A1    Jun. 27, 2024

(51) Int. Cl.
*H01L 21/67* (2006.01)
*G05B 19/418* (2006.01)

(52) U.S. Cl.
CPC .. *H01L 21/67276* (2013.01); *G05B 19/41835* (2013.01); *G05B 19/4186* (2013.01); *G05B 19/41865* (2013.01)

(58) Field of Classification Search
CPC ........ H01L 21/67276; G05B 19/41835; G05B 19/4186; G05B 19/41865; G05B 19/41875
See application file for complete search history.

(56) References Cited

U.S. PATENT DOCUMENTS

| | | | | |
|---|---|---|---|---|
| 6,208,947 B1* | 3/2001 | Beffa | ................ | G01R 31/2894 700/226 |
| 6,957,114 B1* | 10/2005 | Logsdon | ............ | G06Q 10/0631 700/121 |
| 2003/0150908 A1* | 8/2003 | Pokorny | ............ | G05B 13/0285 235/375 |
| 2007/0185759 A1* | 8/2007 | Kataria | ................ | G06Q 30/018 705/300 |
| 2017/0116259 A1* | 4/2017 | Elliot | .................. | G06F 3/04847 |
| 2020/0118311 A1* | 4/2020 | Yousaf | .................. | G06F 16/338 |

* cited by examiner

*Primary Examiner* — Kidest Bahta
(74) *Attorney, Agent, or Firm* — Andrew R. Ralston; Frank D. Cimino (57) ABSTRACT

An IC manufacturing system including a manufacturing tool having a non-standard communication interface and/or protocol capability, wherein a computer platform of the manufacturing tool is configured with a capture engine operable to monitor operator interactions with the manufacturing tool for facilitating an automated electronic out-of-control action plan (eOCAP) scheme in conjunction with a network-hosted server platform.

21 Claims, 5 Drawing Sheets

AUTOMATED OCAP INTERFACING SYSTEM AND METHOD

FIELD OF THE DISCLOSURE

Disclosed implementations relate generally to the field of semiconductor manufacturing. More particularly, but not exclusively, the disclosed implementations relate to an IC manufacturing flow using an out-of-control action plan (OCAP) scheme.

BACKGROUND

Within the semiconductor industry, there is a constant demand for integrated circuits (ICs) that exhibit higher performance at a lower cost. In order to design and manufacture high performance ICs cost-effectively, several parameters associated with the products flowing through a manufacturing process, e.g., process wafers, singulated ICs and packaged semiconductor dies, etc., need to be monitored and carefully controlled. Increasing complexity of manufacturing and the need to correct issues in real time requires that actionable information regarding the various process steps of a process flow is readily available regardless of the type of tooling deployed in a facility.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Some examples of the present disclosure are directed to an IC manufacturing system including a manufacturing tool having a non-standard communication interface and/or protocol, wherein a computer platform of the manufacturing tool may be configured to execute a capture engine operable to monitor operator interactions with the manufacturing tool for facilitating an automated electronic out-of-control action plan (eOCAP) scheme in conjunction with a network-hosted server platform.

In one example, a method of fabricating an IC is disclosed. The method may include processing a lead semiconductor wafer in a process flow having a sequence of process steps including a targeted process step, wherein the targeted process step is performed using a semiconductor fabrication tool and may add to or subtract from a material layer over the lead semiconductor wafer. The method may include capturing information relating to a user interaction at a computer platform integrated with the semiconductor fabrication tool, wherein the user interaction may involve selecting by an operator one or more menu options relative to the operation of the semiconductor fabrication tool. The method may include interrogating an event database based on at least a portion of the captured information relating to the user interaction. Responsive to determining that the at least a portion of the captured information matches a predetermined event condition defined in the event database, a notification may be generated to a server executing an action plan trigger module. Responsive to the notification, an action plan trigger may be generated by the action plan trigger module to actuate an OCAP module configured to determine a disposition action based on the action plan trigger. In one variation, the method may include adjusting one or more process parameters of the targeted process step in response to the disposition action and processing a subsequent semiconductor wafer containing the IC at an intermediate stage of formation. In one arrangement, an example process flow may include attaching packaged integrated circuits to a tape carrier. In one arrangement, an example process flow may include plasma etching a material layer over the semiconductor wafer. In one arrangement, an example process flow may include exposing a photoresist layer to optical radiation. In one arrangement, an example process flow may include chemical mechanical polishing.

In another example, a method of fabricating articles of manufacture is disclosed. The method may include processing a lead article in a process flow having a sequence of process steps including a targeted process step performed by a manufacturing tool. The method may include capturing information relating to a user interaction at a computer platform integrated with the manufacturing tool, the user interaction involving selecting by an operator one or more menu options relative to operation of the manufacturing tool. The method may involve interrogating an event database based on at least a portion of the captured information relating to the user interaction. Responsive to determining that the at least a portion of the captured information matches a predetermined event condition defined in the event database, an action plan trigger may be generated to actuate an OCAP module configured to determine a disposition action responsive to the action plan trigger. Depending on implementation, one or more process parameters of the targeted process step and/or one or more settings of the manufacturing tool may be adjusted in response to the disposition action. In one variation, a subsequent article may be processed using the manufacturing tool after the adjusting.

In another example, a method of fabricating IC is disclosed. The method may include providing a plurality of ICs to a tape-and-reel tool configured to perform a taping operation, wherein each IC is packaged in a corresponding one of a plurality of IC packages, the plurality of IC packages including a first IC package. The method may include capturing information relating to a user interaction at a computer platform integrated with the tape-and-reel tool, wherein the user interaction may involve selecting by an operator one or more menu options relative to operation of the tape-and-reel tool with respect to the first integrated circuit package. The method may include interrogating an event database based on at least a portion of the captured information relating to the user interaction. Responsive to determining that the at least a portion of the captured information matches a predetermined event condition defined in the event database, a notification may be generated to a server executing an action plan trigger module. The method may include generating an action plan trigger by the action plan trigger module to actuate an OCAP module configured to determine a disposition action responsive to the action plan trigger. In one variation, the disposition action may be implemented including modifying one or more parameters of the taping operation. The method may further include processing a subsequent IC package including an instance of the integrated circuit using the taping operation after the modifying.

In a further example, an apparatus including a manufacturing tool and associated computer platform is disclosed, wherein the computer platform may be configured to execute a tool application software module and a script-based capture engine comprising a plurality of program instructions for performing one or more methods set forth herein.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components, structures or subsystems, etc.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. "Directly connected" may be used to convey that two or more physical features touch, or share an interface between each other. Further, in one or more examples set forth herein, generally speaking, an element, component or module may be configured to perform a function if the element may be programmed for performing or otherwise structurally arranged to perform that function.

Without limitation, examples relating to an electronic out-of-control action plan (eOCAP) interfacing scheme will be set forth below in the context of semiconductor IC device manufacturing.

Depending on implementation, a semiconductor IC device manufacturing flow may comprise a number of processing stages involving wafer fabrication and backend operations such as e.g., front-end-of-line (FEOL) operations, middle-of-line (MOL) operations, and back-end-of-line (BEOL) operations, which may be followed by "post-fab" processing stages that may include wafer test, backgrinding, die separation, die test and IC packaging for shipping. Regardless of the process node or technology used and/or the product types involved, the FEOL/MOL/BEOL stages of a flow may comprise one or more thin-film and/or thick-film processing/deposition stages, one or more photo-lithography stages, implant stages, etching stages, chemical-mechanical polishing (CMP) stages, metallization/interconnect stages, etc., among others, wherein a plurality of semiconductor wafers may be processed on a wafer-by-wafer basis, on a lot-by-lot basis, or in a batch mode involving a number of wafer lots or process runs, using appropriate tooling and equipment. At an example process step, a material layer of the semiconductor wafer may be processed so as to alter one or more physical and/or electrical characteristics of the material layer. In some examples, a process step may add to or subtract from a material layer, e.g., deposition of conductive layers, nonconductive or dielectric layers, etching or polishing of layers, and the like. In general, the equipment used in performing the process steps of any FEOL/MOL/BEOL stages of a manufacturing flow may be operated and monitored under various controls, which may be effectuated manually and/or automatically, in order that appropriate information regarding the process parameters, operational settings, operator interaction variables, etc. may be gathered and analyzed for effectuating suitable process control. Similarly, the equipment deployed at various post-fab stages may also be operated and monitored, whereby data may be gathered and analyzed for facilitating appropriate process control.

In some arrangements, one or more statistical process control (SPC) or statistical quality control (SQC) methodologies may be deployed in a manufacturing facility in order to monitor and control a process flow at various stages. In some arrangements, example SPC/SQC methodologies may be deployed at a targeted process stage considered to be a critical process stage so as to help ensure that the targeted process stage is operating efficiently and within control, thereby producing more conforming products with less waste (e.g., rework, scrap or other disposition). For example, process wafers, wafer lots, packaged dies, and/or bulk packaged goods (e.g., tape carrier products containing packaged dies), etc., collectively referred to as sampling units, may be monitored to confirm that applicable control limits and/or specification thresholds are satisfied with respect to one or more measurement parameters and/or variables relevant to the sampling units processed at the targeted process stage. In some arrangements, example SPC/SQC methodologies may include generating run charts, control charts, etc., as well as performing process capability analyses and/or conducting statistically designed experiments, and the like, wherein measurement data as well as equipment settings data may be produced, processed, stored, and deployed for purposes of management, monitoring and quality control.

Although various process stages and associated equipment may be controlled and monitored by deploying suitable instrumentation, it should be appreciated that fabrication flows having a large number of process stages and diverse tooling options can generate enormous amounts of data even in implementations where the processes are considered to be stable and/or in control. In order to facilitate interoperability of the equipment at different process stages as well as to ensure uniformity and compatibility of the collected data, the deployed equipment and/or associated computer platforms may be provided with standardized network interfacing and/or communications protocols in some implementations. In some deployment scenarios, different equipment at various process stages may be connected to a centralized host network platform using different standardized network and communications protocols depending on the process stage involved.

A group of interconnectivity standards known as the Semiconductor Equipment and Materials International (SEMI) Equipment Communications Standard (SECS)/Generic Equipment Model (GEM) communication interface standard, collectively referred to as the SECS/GEM interface protocol, may be deployed in a semiconductor facility at different stages, wherein the various constituent standards may be used to define communications between different equipment and a host network of the facility in order to enable Smart Factory Manufacturing. Depending on implementation, the SECS/GEM interface protocol may be configured in an automated fab/foundry to effectuate a number of tasks and actions, e.g., starting and stopping equipment processing, collecting measurement data, changing settings, variables and parameters of the equipment, selecting process recipes, monitoring events and alarms, as well as facilitating the execution of additional equipment controls for events that may be defined as events requiring some disposition action with respect to any work-in-process (WIP) product. In some arrangements, the SECS/GEM interface protocol may be configured to provide a framework for defining a common set of equipment behavior modalities and communications capabilities in a manufacturing environment. In some examples, the SECS/GEM interface protocol may be deployed for configuring messages, alarms, notifications, state machines, etc., in order to enable host software applications that may be provided for controlling and monitoring the equipment, wherein the host software applications may in turn be interfaced and/or otherwise integrated with an OCAP platform for facilitating suitable disposition based on the alarms, event notifications, and the like.

In some arrangements, however, the deployed equipment at a process stage may be provided with communication interfaces and/or protocols other than a standardized communications and network interfacing protocol such as the SECS/GEMS protocol. For example, the deployed equipment may comprise legacy tools that may not be compatible with a standard protocol and/or end-of-life tools that may not have the capability to support interface upgrades to achieve compatibility. In such scenarios, proprietary interfacing and communications protocols may be provided with the equipment for effectuating data collection and monitoring. In general, such non-standard protocols and interfaces may be highly specific depending on the equipment manufacturer, fabrication/foundry facility, process stages involved, etc., and may not be amenable to interfacing with the OCAP infrastructure of a manufacturing plant. As such, human operator interactions may be needed for facilitating process control, including obtaining measurement data, logging event notifications and alarms, etc. It should be appreciated that operator-mediated interactions with the equipment can be highly susceptible to errors, including, e.g., unintentional nonconformance to standard operating procedures or SOPs due to negligence. Where certain predetermined/critical events are involved, any inadvertent omission or oversight in interacting with the equipment may have a detrimental impact on the quality of the product.

Examples of the present disclosure may be configured to provide an alarm or event notification system for automatically triggering an OCAP scheme of a manufacturing facility even in the absence of standardized interface protocols such as the SECS/GEMS. As will be set further forth below, an example implementation may be illustrated, without limitation, in the context of a backend tape-and-reel process stage of a semiconductor IC manufacturing flow.

Figure 1:
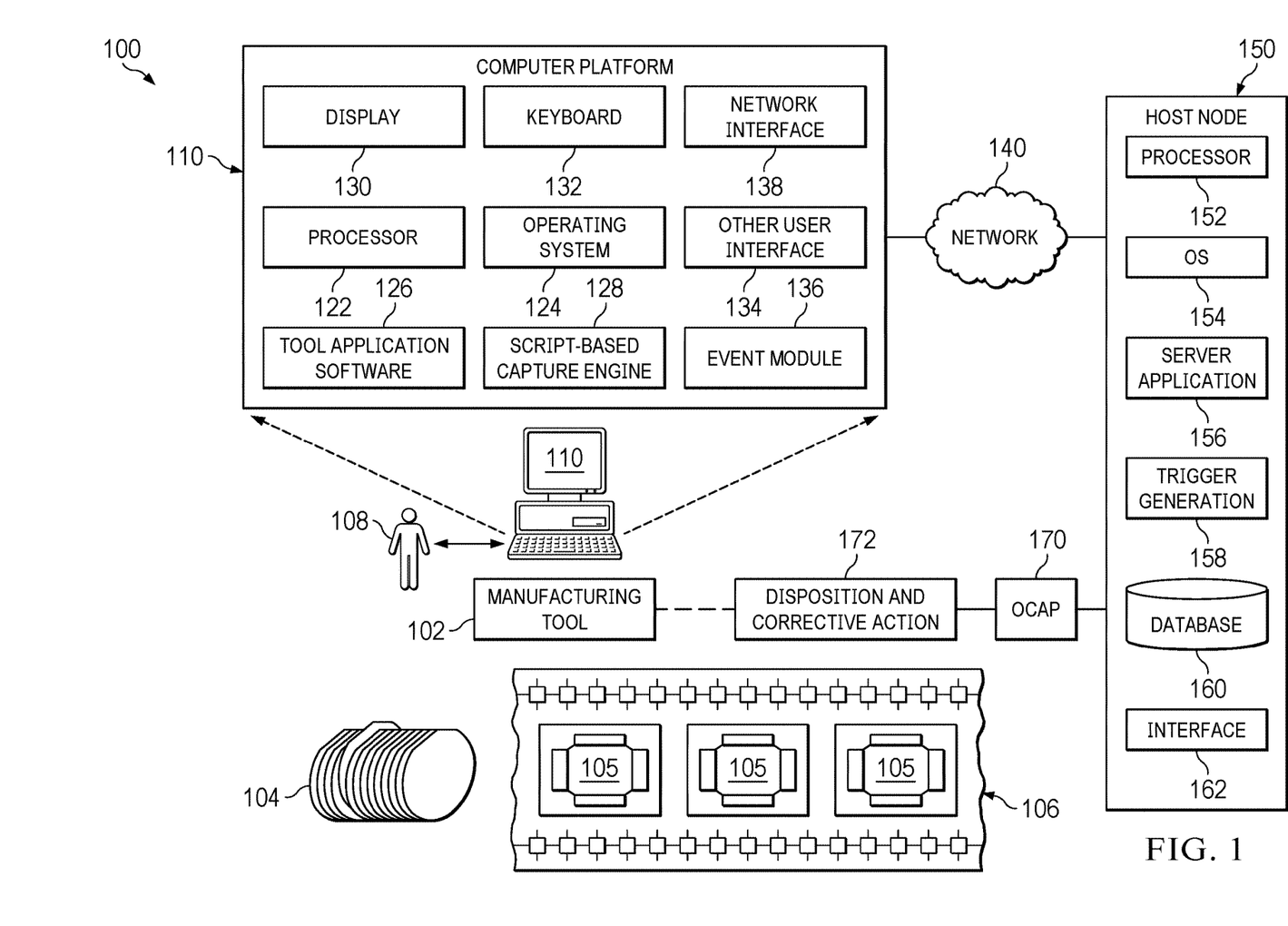
FIG. 1 depicts a representative manufacturing system including a processing tool wherein out-of-control action plan (OCAP) capability may be implemented according to some examples of the present disclosure.

Referring to the drawings, FIG. 1 depicts a representative manufacturing system 100 wherein an OCAP scheme may be implemented according to some examples of the present disclosure. Depending on implementation and the process stage involved, an example manufacturing/processing tool 102 may comprise suitable equipment configured for processing wafers, singulated dies, or container goods such as tape carrier products configured to carry a predetermined quantity of packaged dies, and the like. In one variation, a plurality of wafers 104 are shown in FIG. 1 that may be processed by the processing tool 102 at a targeted process step wherein a semiconductor wafer may contain a plurality of ICs at an intermediate stage of formation. In another variation, example tool 102 may comprise a tape-and-reel equipment configured to effectuate pick-and-place operations for producing an end product such as a tape carrier reel 106 containing a predetermined number of packaged dies 105. Regardless of the manufacturing stage involved, a human operator 108 may interact with a computer platform 110 coupled to or otherwise integrated with the processing tool 102 for performing a variety of tasks such as, e.g., selecting a process recipe, adjusting or readjusting one or more tool settings, responding to notifications or guidance messages, etc. In an example arrangement, the computer platform 110 may be based on any computer hardware/software architecture and may comprise a variety of user interfaces and peripherals for facilitating user interaction with the processing tool 102. Depending on implementation, the computer platform 110 may include one or more processors 122 operable to execute suitable tool application software 126 supported by an operating system (OS) 124 (e.g., Microsoft Windows®, Unix-based OS, Apple® iOS, Mac® OS, etc.), wherein the computer platform 110 may be accessed by the user via one or more interfaces provided with the computer platform 110 and/or by way of a handheld or portable mobile computing device operating in known or heretofore unknown wireless communications technologies. Example user interfaces (UIs) may comprise one or more devices, e.g., keyboards, pointing devices or computer mice, touchscreens or touch pads, scroll pads, audio input devices such as mics, haptic interface devices, etc. By way of illustration, a display 130, a keyboard 132 as well as other UIs 134 associated with the computer platform 110 are exemplified in FIG. 1. With respect to network connectivity, one or more network interfaces, e.g., I/F 138, may be provided with the computer platform 110 for effectuating a wired or wireless communication link to a host node or platform 150 disposed in a network 140 that may be configured to receive and transmit communications with one or more manufacturing tools of a facility (e.g., tool 102) in some arrangements.

In one example, host node 150 may comprise a server computer platform based on any known or heretofore unknown computer hardware and software architecture, which may include one or more processors 152, a suitable OS 154, a server application 156 configured to execute a trigger generation module 158 for generating an OCAP trigger or message to an OCAP system 170 associated with the manufacturing system 100. As will be set forth in detail further below, the server application 156 and associated trigger generation module 158 may be configured to generate suitable OCAP triggers in response to event-driven notifications provided by the tool computer platform 110 based on operator interactions relative to the tool operations, procedures and protocols. Depending on how the OCAP system 170 is implemented, e.g., specifying the various disposition actions or sequences of actions to be undertaken in response to the reported out-of-control (OOC)/out-of-specification (OOS) events, occurrences, or incidents, etc., with respect to the tool operations, a disposition and corrective action module 172 may be executed to remedy or otherwise address an OOC/OOS event. Where the targeted process stage is a FEOL/MOL/BEOL stage, example corrective actions may involve identifying wafers for scrapping or reworking, for example, depending on the facility's fabrication flow management strategy including cost-benefit considerations as to wafer scrap and reworking guidelines. If the targeted process stage is a post-fab stage involving packaged goods, appropriate dispositioning may involve holding the goods to ensure proper completion of a customer order (e.g., where a reported event is a shortfall in the total number of packaged dies in a carrier reel configured to contain a predetermined quantity). In some implementations, dispositioning and corrective action may also be based on the institutional knowledge as well as domain expertise relating to the targeted process stage, which may be administered by human operations, expert systems, or any combination thereof.

In one arrangement, a capture engine 128 may be provided for capturing various user interactions of the operator 108 with the computer platform 110 of the manufacturing tool 102. In an example implementation, the capture engine 128 may comprise a script-based module that may be executed in a runtime environment of the tool application software 126 executed on the computer platform 110. Depending in the software architecture of the computer platform 110, the tool application software 126 may be based on a higher level, compiled language whereas the capture engine 128 may be based on a scripting language that is interpreted line by line during runtime by an interpreter. In some arrangements, the capture engine 128 may also be based on a scripting language that is both compiled and interpreted. In some arraignments, the scripting language used for the capture engine 128 may be platform-specific (e.g., depends on the OS) or platform-agnostic (e.g., the capture engine 128 may be executed on any OS). Where the capture engine 128 is configured as a platform-agnostic module, it may be implemented as a "write once, run anywhere" (WORA) program that may be a standalone application or integrated with the tool application software 126 in some example arrangements.

In an example implementation, the capture engine 128 may be configured to capture, log, monitor, or otherwise obtain indications of various types of user interactions by the operator 108 depending on the I/F hardware/software configuration of the computer platform 110. By way of illustration, the capture engine 128 may be operable to monitor keystrokes, pointing device movements and selections, touchscreen inputs such as zoom, pinch, scroll, etc., as well as audio/video and kinetic/haptic inputs effectuated by the operator 108. In some arrangements involving the display screen 130, user inputs or selections with respect to one or more dialog boxes such as login boxes, window layouts, pulldown menus, etc. may be identified by specific names or other indicia, which may be logged by the capture engine 128 for analysis. Depending on implementation, captured event data including the IDs/names of different menu windows, dialog boxes, timestamps of the events, etc., as well as the user interaction data (key IDs or ASCII codes, pointing device actions and names of the radio buttons, checkboxes or other graphical control elements clicked or pressed, etc.) may be provided as part of a query for interrogating an event definition database 136 in order to determine whether the captured data matches a predetermined event condition (e.g., a critical event condition defined by the manufacturing facility). In some additional or alternative arrangements, an analytical module of the capture engine 128 may be configured to analyze the captured data and generate suitable database queries for determining whether a predetermined or critical event condition is detected. Responsive to detecting or determining that a predetermined event condition exists, a notification, message or other communication report may be generated by the capture engine 128, which may be pushed to the host node 150 for storage, e.g., in a database 160, and further analysis by the server application 156 to generate an action plan trigger for transmission to the OCAP module 170 via a network interface 162.

In an example arrangement, the capture engine 128 may be implemented based on a variety of scripting languages such as, without limitation, JavaScript, Python, Perl, Ruby, Lua, Bash, to name a few. In an example arrangement, the server application 156 and associated trigger generation module 158 may be implemented using an object-oriented programming language such as Visual Basic which may configured on a Microsoft Visual Studio platform provided as an integrated development environment (IDE). Skilled artisans will recognize upon reference hereto that the foregoing software modules, tool-side as well as server-side, may be implemented using a variety of computer languages and development platforms and the examples of the present disclosure are not limited to the representative arrangements set forth herein.

Figure 2:
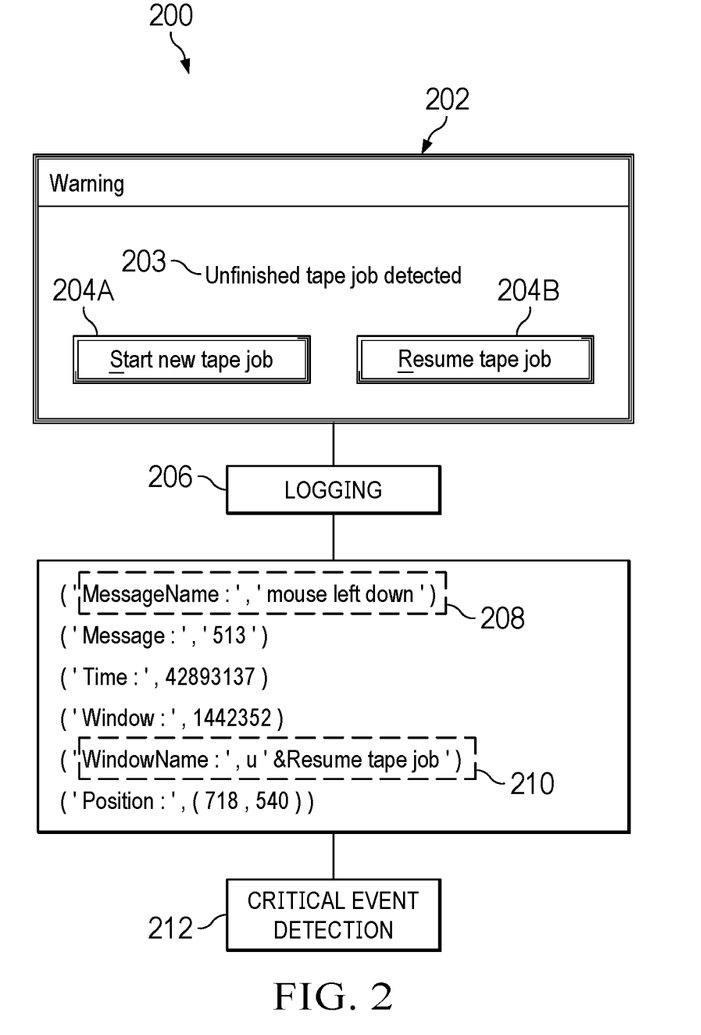
FIG. 2 depicts an example scenario wherein a representative user interaction relating to an operator of a tape-and-reel processing equipment may be captured using a scripting language for facilitating predetermined event detection according to some examples of the present disclosure.

FIG. 2 depicts an example scenario 200 wherein a representative user interaction relating to an operator of a tape-and-reel processing equipment may be captured using a scripting language for facilitating event detection according to some examples of the present disclosure. Component misplacement in a tape-and-reel process can be a common occurrence in some deployments, especially for small form factor products such as thin quad flat packs (TQFPs), plastic QFPs (PQFPs), etc. In general, there is a tendency for the small form factor units to be misplaced, e.g., partial placement out of pockets or cavities defined in the carrier tape or missing in the pockets entirely. Further, there may be in-process error conditions, such as, e.g., a vacuum line of the tape-and-reel tool indicating an error, which may necessitate a "purge and cut" operation by an operator, resulting in a partially filled reel (e.g., having a shortfall). In such scenarios where there is a shortfall in a reel, an operator may be provided with a dialog box 202 in respect of a new reel job that includes an indication 203 that an unfinished tape job was detected in a previous run, in addition to indicating two options to select, e.g., a "Start new tape job" option 204A or a "Resume a tape job" option 204B. A standard operating procedure in this scenario may be for the operator to select option 204A, indicating that a new tape job to be commenced. On the other hand, if option 204B is selected inadvertently, the tool may fill the new reel with the previous job's shortfall rather than a complete set of the units (e.g., 1000 units). For example, if the previous job was terminated with a purge and cut operation resulting in a reel with X units rather than 1000 units (X<1000), an incorrect selection of option 204B (i.e., "Resume a tape job" option) upon commencing a new job would result in a new reel having (1000−X) units rather than the full complement. Whereas the first partially filled reel may be interdicted because the operator was aware of the tool's vacuum line error and took an action to address that error, the second occurrence of noncompliant product in a subsequent run may remain undetected, thereby introducing quality control issues at the customer end.

A capture engine of the present disclosure may be configured to monitor and log the keystrokes and/or mouse selections effected by the operator in the foregoing scenario, as exemplified by a logger 206, resulting a captured user data output 208. As described previously, the captured user data output 208 may be analyzed to detect that the user erroneously selected option 204B rather than option 204A. Based on the process knowledge that such a selection would yield a noncompliant reel, an analytical module may determine that such an event is a predetermined/critical event requiring an OCAP trigger for proper dispositioning, as indicated by critical event detection block 212. Accordingly, a notification may be transmitted to a host node, e.g., node 150 described above in reference to FIG. 1, whereupon a suitable action plan trigger may be generated for activating an OCAP process as previously described.

Figure 3A:
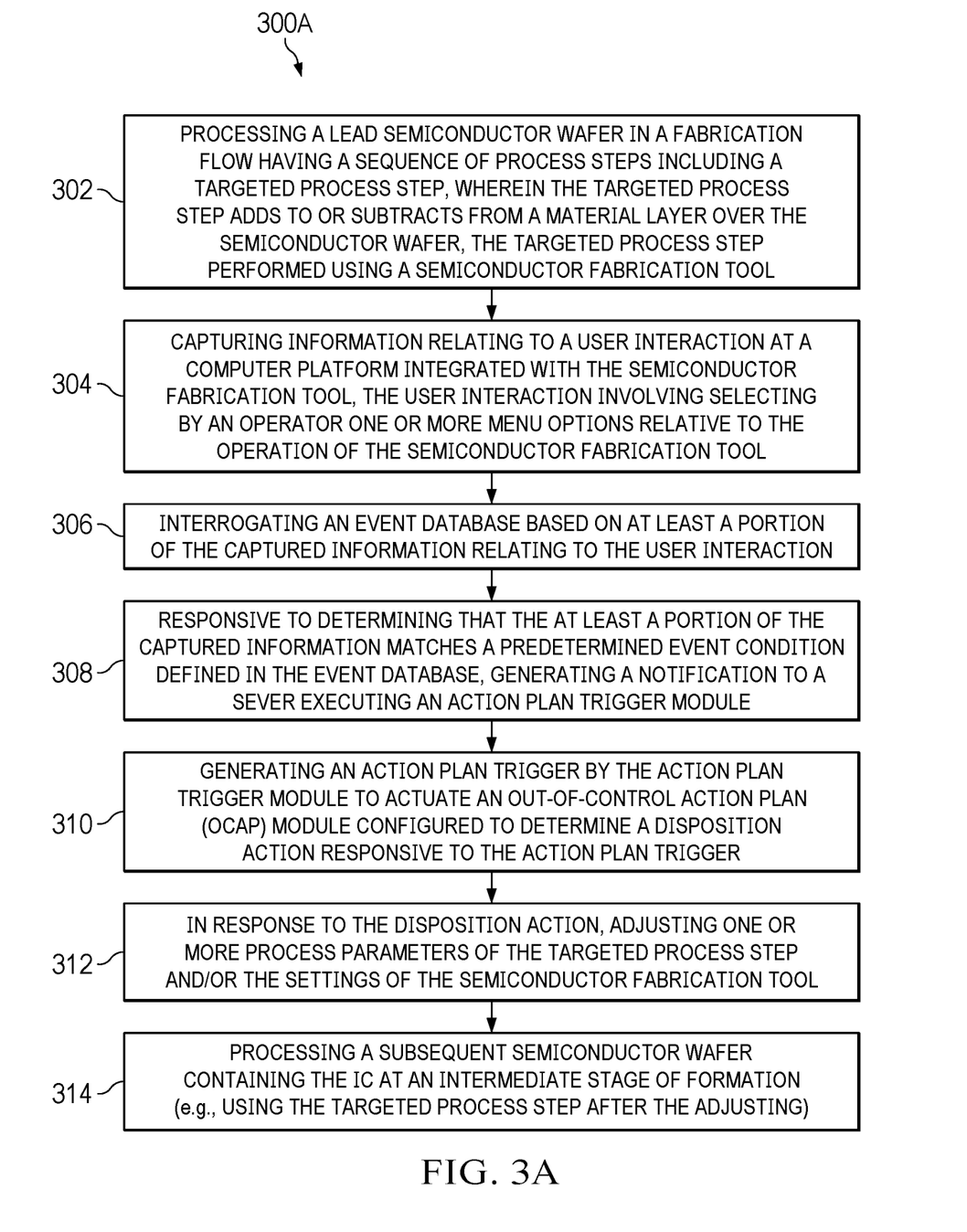
FIGS. 3A and 3B are flowcharts of an IC fabrication method according to some examples of the present disclosure.
Figure 3B:
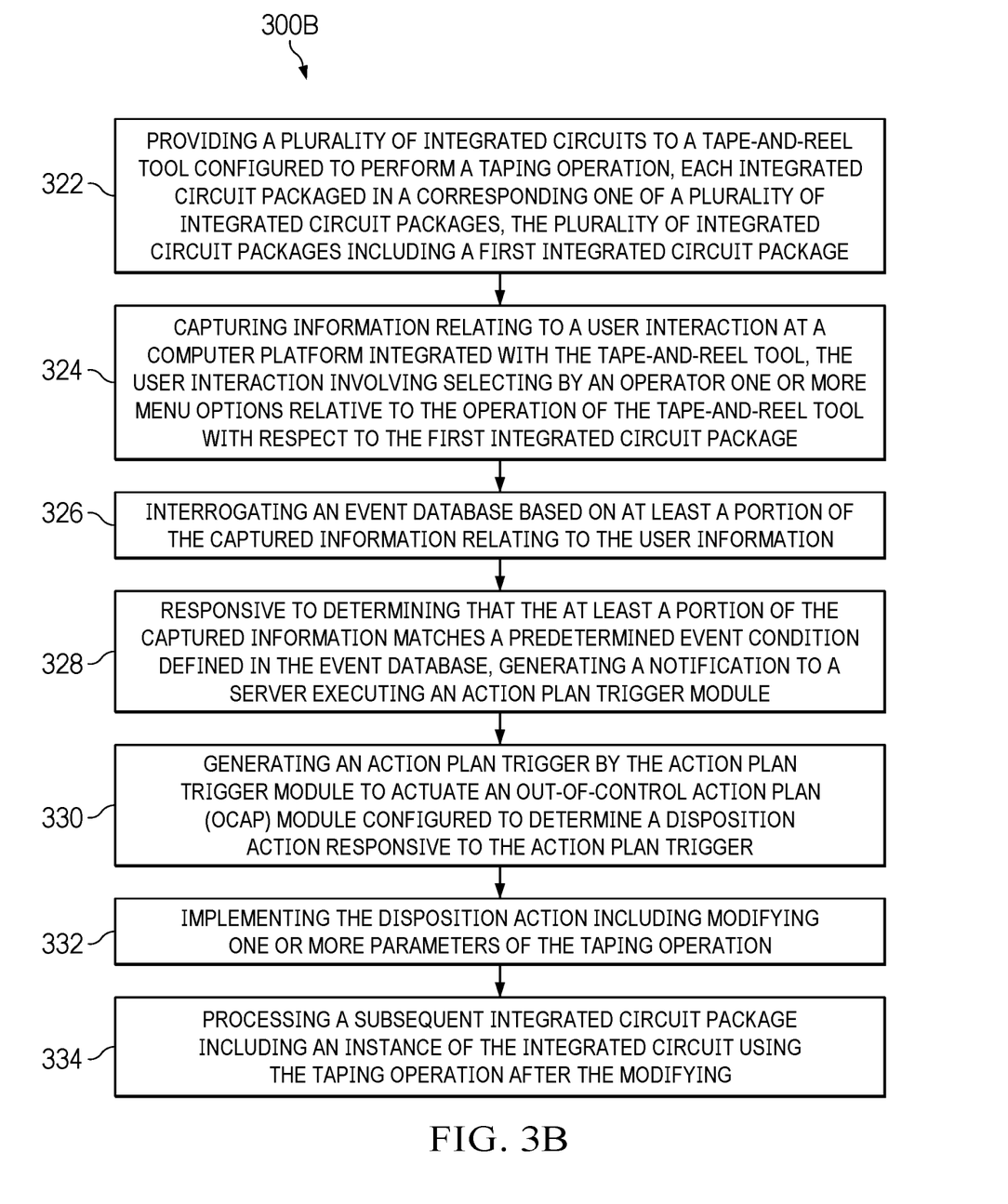

FIGS. 3A and 3B are flowcharts of an IC fabrication method according to some examples of the present disclosure. Example method 300A of FIG. 3A may comprise processing a semiconductor wafer in a fabrication flow or process having a sequence of process steps including a targeted process step, wherein the targeted process step adds to or subtracts from a material layer over a semiconductor wafer, e.g., a lead semiconductor wafer, as shown at block 302. As set forth previously, the targeted process step may be performed using a semiconductor fabrication tool having a suitable computer platform integrated or otherwise associated therewith. At block 304, information pertaining to one or more user interactions at the computer platform may be captured, e.g., by way of a script-based capture engine, wherein the user interaction(s) may involve selecting by an operator one or more menu options relative to the operation of the semiconductor fabrication tool. At block 306, an event database may be interrogated based on at least a portion of the captured information relating to the user interaction. Responsive to determining that the at least a portion of the captured information matches a predetermined event condition defined in the event database, a notification may be generated, which may be transmitted to a server disposed in a host network, wherein the server may be configured to execute an action plan trigger module in response to a push mechanism, a scheduled pull mechanism, or a combination thereof (block 308). At block 310, an action plan trigger may be generated by the action plan trigger module to actuate an OCAP module or subsystem configured to determine a disposition action responsive to the action plan trigger. In one variation, one or more process parameters and/or one or more settings of the semiconductor fabrication tool may be (re)adjusted in response to the disposition action (block 312). Thereafter, a subsequent semiconductor wafer containing the IC may be processed at an intermediate stage of formation (block 314), e.g., using the targeted process step after the adjusting. In one variation, the disposition action may be indicative of reworking one or more semiconductor wafers, whereupon the targeted process step may be repeated with or without further operator interactions with the fabrication tool.

In some additional and/or alternative arrangements, where control limits are also used in a measurement dispositioning process at the targeted process step, an out-of-control (OOC) condition may be used as an early warning signal in an example implementation. In general, control limits are tighter than specification thresholds established for a monitored parameter, which allows for executing a variety of corrective actions including, e.g., advancing a current process run that fails to meet the control limits but satisfies the specification thresholds. In such a scenario, the current process run may be appropriately flagged for downstream inspection and dispositioning.

In some arrangements, OCAP-based dispositioning of wafers may also be dependent on one or more process history considerations such as, e.g., special work requests including engineering work lots, hand carry lots (e.g., customer demonstration or demo lots with high priority samples), tool interdiction and monitoring system lots designated for special process control reasons, preventive maintenance lots, and the like.

FIG. 3B illustrates a manufacturing flow involving a tape-and-reel process 300B according to an example. At block 322, a plurality of integrated circuits (ICs) may be provided to a tape-and-reel tool configured to perform a taping operation, wherein each IC is packaged in a corresponding one of a plurality of integrated circuit packages, the plurality of integrated circuit packages including a first integrated circuit package. At block 324, information relating to a user interaction at a computer platform integrated with the tape-and-reel tool may be captured. As previously noted, the user interaction may involve selecting by an operator one or more menu options relative to operation of the tape-and-reel tool with respect to the first integrated circuit package. At block 326, an event database may be interrogated based on at least a portion of the captured information relating to the user interaction. Responsive to determining that the at least a portion of the captured information matches a predetermined/critical event condition defined in the event database, a notification may be generated to a server executing an action plan trigger module (block 328). An action plan trigger may be generated, e.g., in response to the notification obtained via a pull or a push mechanism, by the action plan trigger module to actuate an OCAP module configured to determine a disposition action responsive to the action plan trigger (block 330). In one implementation, the disposition action may include modifying one or more parameters of the taping operation (block 332). In some examples, a subsequent IC package may be processed including an instance of the integrated circuit using the taping operation after the modifying (block 334).

Figure 4:
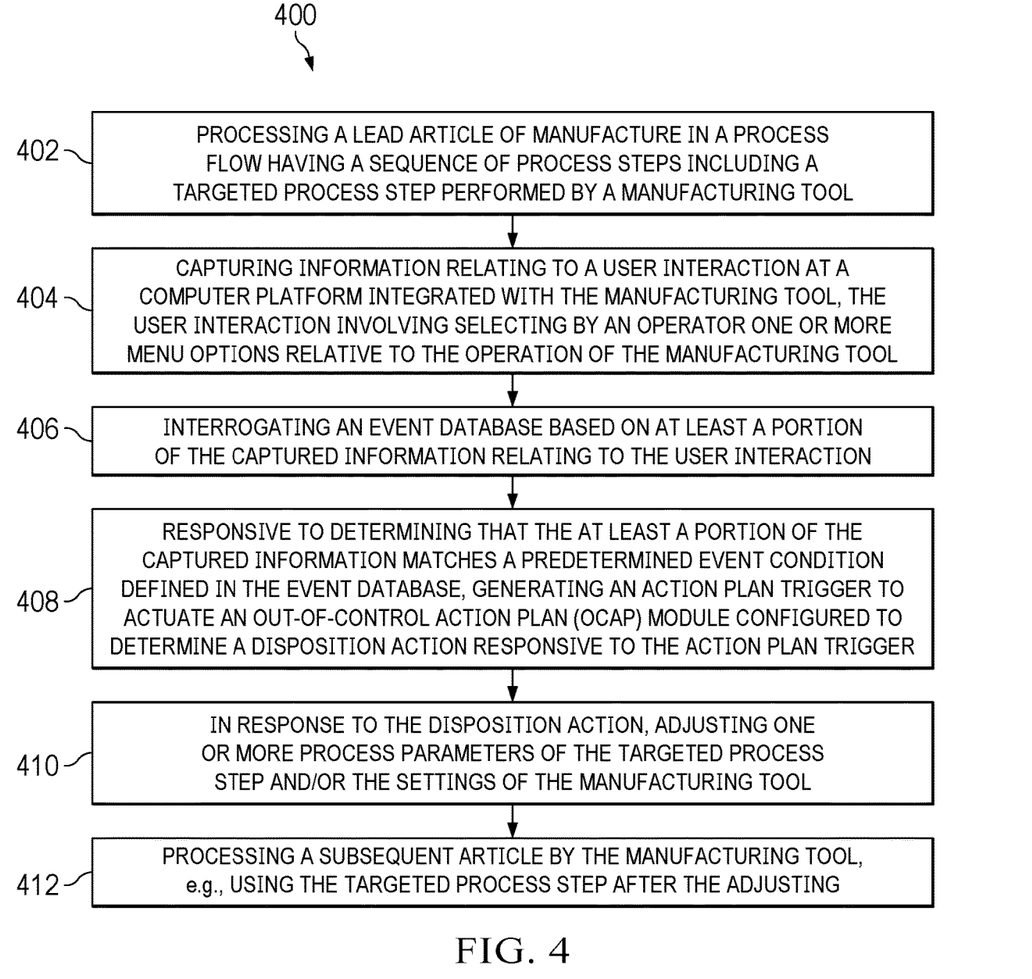
FIG. 4 is a flowchart of a method for fabricating articles of manufacture according to an example of the present disclosure.

FIG. 4 is a flowchart of a method for fabricating articles of manufacture according to an example of the present disclosure. For purposes herein, "articles" may be produced by any manufacture from raw or prepared materials, wherein the materials are given new forms, qualities, properties, or combinations, in any type of industry. Depending on implementation, articles may be produced in a variety of modes, e.g., batch production, continuous production, flow production, etc., wherein a suitable manufacturing sampling unit (MSU) may comprise a single article of manufacture or a group of articles of manufacture. Example method 400 may include processing a current MSU of the articles (e.g., a lead article of manufacture in a batch) in a process flow having a sequence of process steps including a targeted process step performed by a manufacturing tool (block 402). At block 404, information relating to a user interaction at a computer platform integrated with the manufacturing tool may be captured using a script-based capture engine, wherein the user interaction may involve selecting by an operator one or more menu options relative to the operation of the manufacturing tool as previously described. At block 406, an event database may be interrogated based on at least a portion of the captured information relating to the user interaction. Depending on implementation, the event database may be co-located or otherwise integrated with the computer platform or configured as a network-based storage. Responsive to determining that the at least a portion of the captured information matches a predetermined event condition defined in the event database, an action plan trigger may be generated to actuate an OCAP module or subsystem configured to determine a disposition action responsive to the action plan trigger (block 408). In one arrangement, the action plan trigger may be generated by the capture engine configured to execute in a runtime environment of the computer platform. In another variation, the capture engine may be configured to generate an event notification to a host server disposed on a network, wherein the host server is operable to execute a server application configured to generate the action plan trigger. In another variation, the event database, the capture engine, the server application, and/or the OCAP module may be implemented on an intranet, an enterprise network, or as a public/private/hybrid cloud platform.

In an example implementation, one or more process parameters of the targeted process step and/or one or more settings of the manufacturing tool may be (re)adjusted in response to the disposition action (block 410). A subsequent MSU or article may be processed by the manufacturing tool using the targeted process step after the adjusting (block 412).

Various disclosed methods and systems of the present disclosure may be beneficially applied to any manufacturing process in order to dynamically and automatically generate OCAP-compatible action plan triggers even where tools having non-standardized interface and communication protocols are deployed. Further, examples set forth herein may be adaptable to and/or in different manufacturing environments, wherein factory-specific predetermined/critical events, action plans, disposition mechanisms, etc., may be implemented in a configurable manner such that inadvertent operator errors, caused by omission or commission, may be prevented from propagating unheeded in a manufacturing flow thereby negatively impacting the overall quality of a product. While such example arrangements may be expected to provide various tangible improvements in the management of a process flow, no particular result is a requirement unless explicitly recited in a particular claim.

One or more examples of the present disclosure may be implemented using different combinations of software, firmware, and/or hardware. Thus, one or more of the techniques shown in the Figures (e.g., flowcharts) may be implemented using code and data stored and executed on one or more electronic devices or nodes (e.g., a workstation, a network element, etc.). Such electronic devices may store and communicate (internally and/or with other electronic devices over a network) code and data using computer-readable media, such as non-transitory computer-readable storage media (e.g., magnetic disks, optical disks, random access memory, read-only memory, flash memory devices, phase-change memory, etc.), transitory computer-readable transmission media (e.g., electrical, optical, acoustical or other form of propagated signals—such as carrier waves, infrared signals, digital signals), etc. In addition, some network elements or workstations, e.g., configured as servers, may typically include a set of one or more processors coupled to one or more other components, such as one or more storage devices (e.g., non-transitory or persistent machine-readable storage media) as well as storage database(s), user input/output devices (e.g., a keyboard, a touch screen, a pointing device, one or more imaging capturing devices and/or a display, etc.), and network connections for effectuating signaling and/or data transmission. The coupling of the set of processors and other components may be typically through one or more buses and bridges (also termed as bus controllers), arranged in any known (e.g., symmetric/shared multiprocessing) or heretofore unknown architectures. Thus, the storage device or component of a given electronic device or network element may be configured to store program code and/or data for execution on one or more processors of that element, node or electronic device for purposes of implementing one or more techniques of the present disclosure.

At least some examples are described herein with reference to one or more system diagrams/schematics, block diagrams and/or flowchart illustrations. It is understood that such diagrams and/or flowchart illustrations, and combinations of blocks in the block diagrams and/or flowchart illustrations, can be implemented by any appropriate circuitry configured to achieve the desired functionalities. Accordingly, some examples of the present disclosure may be embodied in hardware and/or in software (including firmware, resident software, micro-code, etc.) operating in conjunction with suitable processing units or microcontrollers, which may collectively be referred to as "circuitry," "a module" or variants thereof. An example processing unit or a module may include, by way of illustration, a general purpose processor, a special purpose processor, a conventional processor, a digital signal processor (DSP), an image processing engine or unit, a plurality of microprocessors, one or more microprocessors in association with a DSP core, a controller, a microcontroller, Application Specific Integrated Circuits (ASICs), Field Programmable Gate Array (FPGA) circuits, any other type of integrated circuit (IC), and/or a state machine, as well as programmable system devices (PSDs) employing system-on-chip (SoC) architectures that combine memory functions with programmable logic on a chip that is designed to work with a standard microcontroller. Example memory modules or storage circuitry may include volatile and/or non-volatile memories such as, e.g., random access memory (RAM), electrically erasable/programmable read-only memories (EEPROMs) or UV-EPROMS, one-time programmable (OTP) memories, Flash memories, static RAM (SRAM), etc.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. A method of fabricating an integrated circuit (IC), the method comprising:
   processing a lead semiconductor wafer in a process flow having a sequence of process steps including a targeted process step, wherein the targeted process step adds to or subtracts from a material layer over the lead semiconductor wafer, the targeted process step performed using a semiconductor fabrication tool;
   capturing information relating to a user interaction at a computer platform integrated with the semiconductor fabrication tool, the user interaction involving selecting by an operator one or more menu options relative to operation of the semiconductor fabrication tool;
   interrogating an event database based on at least a portion of the captured information relating to the user interaction;
   responsive to determining that the at least a portion of the captured information matches a predetermined event condition defined in the event database, generating a notification to a server executing an action plan trigger module;
   generating an action plan trigger by the action plan trigger module to actuate an out-of-control action plan (OCAP) module configured to determine a disposition action responsive to the action plan trigger;
   adjusting one or more process parameters of the targeted process step in response to the disposition action; and
   processing a subsequent semiconductor wafer containing the IC at an intermediate stage of formation.

2. The method as recited in claim 1, wherein the process flow includes attaching packaged integrated circuits to a tape carrier.

3. The method as recited in claim 1, wherein the process flow includes plasma etching the material layer.

4. The method as recited in claim 1, wherein the process flow includes exposing a photoresist layer to optical radiation.

5. The method as recited in claim 1, wherein the process flow includes chemical mechanical polishing.

6. The method as recited in claim 1, wherein the information relating to the user interaction is captured by a script-based capture engine executing in a runtime environment executed on the computer platform of the semiconductor fabrication tool.

7. The method as recited in claim 6, wherein the semiconductor fabrication tool communicates using a protocol other than a SEMI (Semiconductor Equipment and Materials International) Equipment Communications Standard (SECS)/Generic Equipment Model (GEM) communication protocol.

8. The method as recited in claim 6, wherein the script-based capture engine is configured based on a scripting language comprising one of JavaScript, Python, Perl, Ruby, Lua, and Bash.

9. The method as recited in claim 6, wherein the user interaction comprises interacting with the one or more menu options using at least one of a keyboard, a pointing device, a touchscreen, an audio input device, and a haptic interface.

10. A method of fabricating articles of manufacture, the method comprising:
    processing a lead article in a process flow having a sequence of process steps including a targeted process step performed by a manufacturing tool;
    capturing information relating to a user interaction at a computer platform integrated with the manufacturing tool, the user interaction involving selecting by an operator one or more menu options relative to operation of the manufacturing tool;
    interrogating an event database based on at least a portion of the captured information relating to the user interaction;
    responsive to determining that the at least a portion of the captured information matches a predetermined event condition defined in the event database, generating an action plan trigger to actuate an out-of-control action plan (OCAP) module configured to determine a disposition action responsive to the action plan trigger;

adjusting one or more process parameters of the targeted process step in response to the disposition action; and processing a subsequent article by the manufacturing tool after the adjusting.

11. An apparatus, comprising:

a manufacturing tool configured to process an article at a targeted process step of a process flow having a sequence of process steps; and a computer platform integrated with the manufacturing tool, the computer platform including a processor, a tool application software module and a script-based capture engine configured to perform;

capturing information relating to a user interaction at the computer platform, the user interaction involving selecting by an operator one or more menu options relative to operation of the manufacturing tool;

interrogating an event database based on at least a portion of the captured information relating to the user interaction; and     responsive to determining that the at least a portion of the captured information matches a predetermined event condition defined in the event database, generating a notification to a server executing an action plan trigger module, wherein the action plan trigger module is operable to generate an action plan trigger for actuating an out-of-control action plan (OCAP) module configured to determine a disposition action responsive to the action plan trigger.

12. The apparatus as recited in claim 11, wherein the manufacturing tool comprises a tape-and-reel processing equipment, the targeted process step comprising a tape-and-reel assembly process, and the article comprising a carrier tape product containing a plurality of packaged semiconductor dies.

13. The apparatus as recited in claim 11, wherein the script-based capture engine is configured to be executed in a runtime environment for capturing the information relating to the user interaction with the manufacturing tool.

14. The apparatus as recited in claim 11, wherein the manufacturing tool is configured to communicate with a networked host using protocol other than a SEMI (Semiconductor Equipment and Materials International) Equipment Communications Standard (SECS)/Generic Equipment Model (GEM) communication protocol.

15. The apparatus as recited in claim 11, wherein the script-based capture engine is configured based on a scripting language comprising one of JavaScript, Python, Perl, Ruby, Lua, and Bash.

16. The apparatus as recited in claim 11, wherein the user interaction comprises interacting with the one or more menu options using at least one of a keyboard, a pointing device, a touchscreen, an audio input device, and a haptic interface associated with the computer platform.

17. A method of fabricating an integrated circuit (IC), the method comprising:

providing a plurality of integrated circuits to a tape-and-reel tool configured to perform a taping operation, each integrated circuit packaged in a corresponding one of a plurality of integrated circuit packages, the plurality of integrated circuit packages including a first integrated circuit package;

capturing information relating to a user interaction at a computer platform integrated with the tape-and-reel tool, the user interaction involving selecting by an operator one or more menu options relative to operation of the tape-and-reel tool with respect to the first integrated circuit package;

interrogating an event database based on at least a portion of the captured information relating to the user interaction;

responsive to determining that the at least a portion of the captured information matches a predetermined event condition defined in the event database, generating a notification to a server executing an action plan trigger module;

generating an action plan trigger by the action plan trigger module to actuate an out-of-control action plan (OCAP) module configured to determine a disposition action responsive to the action plan trigger;

implementing the disposition action including modifying one or more parameters of the taping operation; and processing a subsequent integrated circuit package including an instance of the integrated circuit using the taping operation after the modifying.

18. The method as recited in claim 17, wherein the tape-and-reel tool is configured to communicate with a networked host using a protocol other than a SEMI (Semiconductor Equipment and Materials International) Equipment Communications Standard (SECS)/Generic Equipment Model (GEM) communication protocol.

19. The method as recited in claim 17, wherein the information relating to the user interaction is captured by a script-based capture engine executing in a runtime environment executed on the computer platform of the tape-and-reel tool.

20. The method as recited in claim 19, wherein the script-based capture engine is configured based on a scripting language comprising one of JavaScript, Python, Perl, Ruby, Lua, and Bash.

21. The method as recited in claim 17, wherein the user interaction comprises interacting with the one or more menu options using at least one of a keyboard, a pointing device, a touchscreen, an audio input device, and a haptic interface.

\* \* \* \* \*